(12) United States Patent
Chang et al.

(10) Patent No.: US 8,203,604 B2
(45) Date of Patent: Jun. 19, 2012

(54) CALIBRATION PLATE AND CALIBRATION METHOD

(75) Inventors: Chih-Kuang Chang, Taipei Hsien (TW); Li Jiang, Shenzhen (CN); Dong-Hai Li, Shenzhen (CN); Xiao-Guang Xue, Shenzhen (CN); Zhong-Kui Yuan, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 760 days.

(21) Appl. No.: 12/332,359

(22) Filed: Dec. 11, 2008

(65) Prior Publication Data

US 2010/0096539 A1    Apr. 22, 2010

(30) Foreign Application Priority Data

Oct. 17, 2008   (CN) .......................... 2008 1 0304968

(51) Int. Cl.
*H04N 9/47* (2006.01)
*H04N 7/18* (2006.01)

(52) U.S. Cl. ............................................ 348/95; 348/94

(58) Field of Classification Search ..................... 348/95
See application file for complete search history.

(56) References Cited

U.S. PATENT DOCUMENTS

| 6,933,930 B2 * | 8/2005 | Devige et al. ................. 345/173 |
| 7,196,730 B2 * | 3/2007 | Mihelcic ....................... 348/373 |
| 2010/0271058 A1 * | 10/2010 | Kitai et al. ................ 324/750.19 |

FOREIGN PATENT DOCUMENTS

CN    1525384 A    9/2004

* cited by examiner

*Primary Examiner* — Kristie Shingles
(74) *Attorney, Agent, or Firm* — Altis Law Group, Inc.

(57) ABSTRACT

A calibration plate is configured for revising an image capture apparatus of a vision measuring system. The vision measuring system includes a worktable which is configured for supporting the calibration plate. The calibration plate includes a quadrate portion. A calibration area and a zero marker are formed on the quadrate portion. The calibration area includes a plurality of regions having the same shape.

7 Claims, 4 Drawing Sheets

CALIBRATION PLATE AND CALIBRATION METHOD

BACKGROUND

1. Technical Field

Embodiments of the present disclosure relate to calibration plates and calibration methods, and more particularly to a calibration plate and a calibration method for an image capture apparatus of a vision measuring system.

2. Description of the Related Art

Vision measuring systems are configured to measure dimensions of workpieces. A vision measuring system usually includes an image capture apparatus for capturing an image of a workpiece to be tested. Various parameters, such as temperature, humidity and optic parameters, may affect a lens of an image capture apparatus. Thus, a captured image may not accurately represent the workpiece, which can lead to errors.

Therefore, what is needed, is a calibration plate and a calibration method which can solve the above problem.

DETAILED DESCRIPTION

Figure 1:
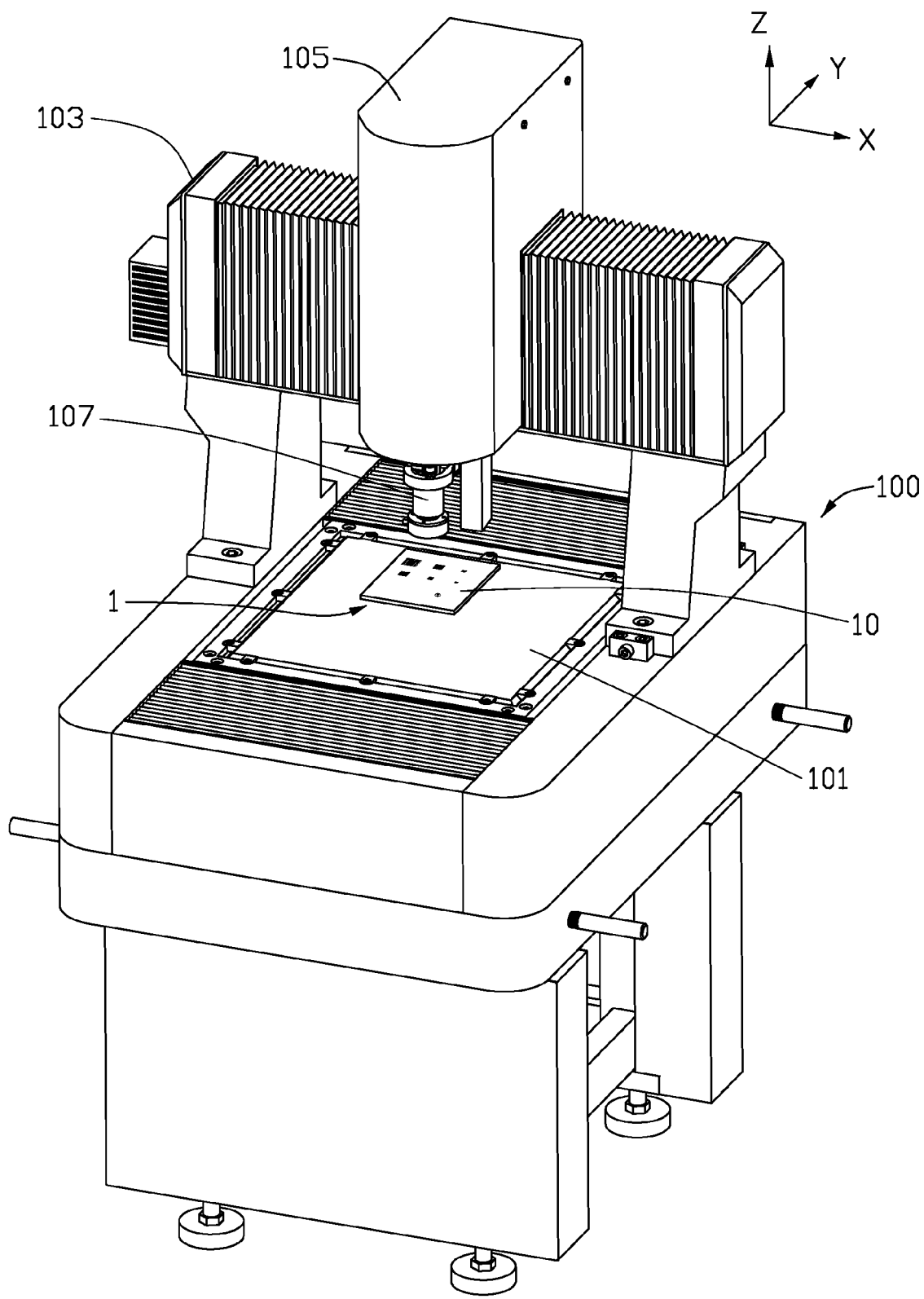
FIG. 1 is an isometric view of an embodiment of a calibration plate and a vision measuring system.
Figure 2:
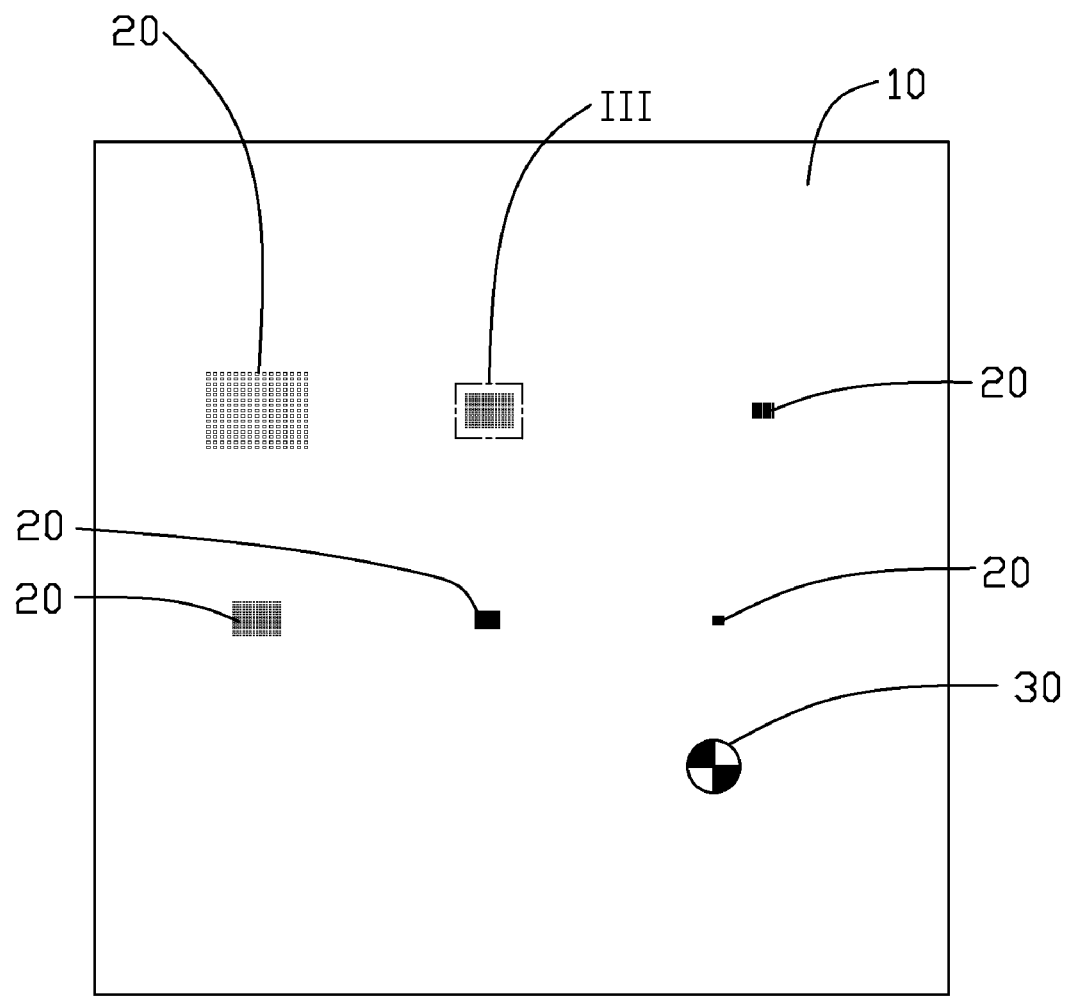
FIG. 2 is a top plan view of the calibration plate of FIG. 1.
Figure 3:
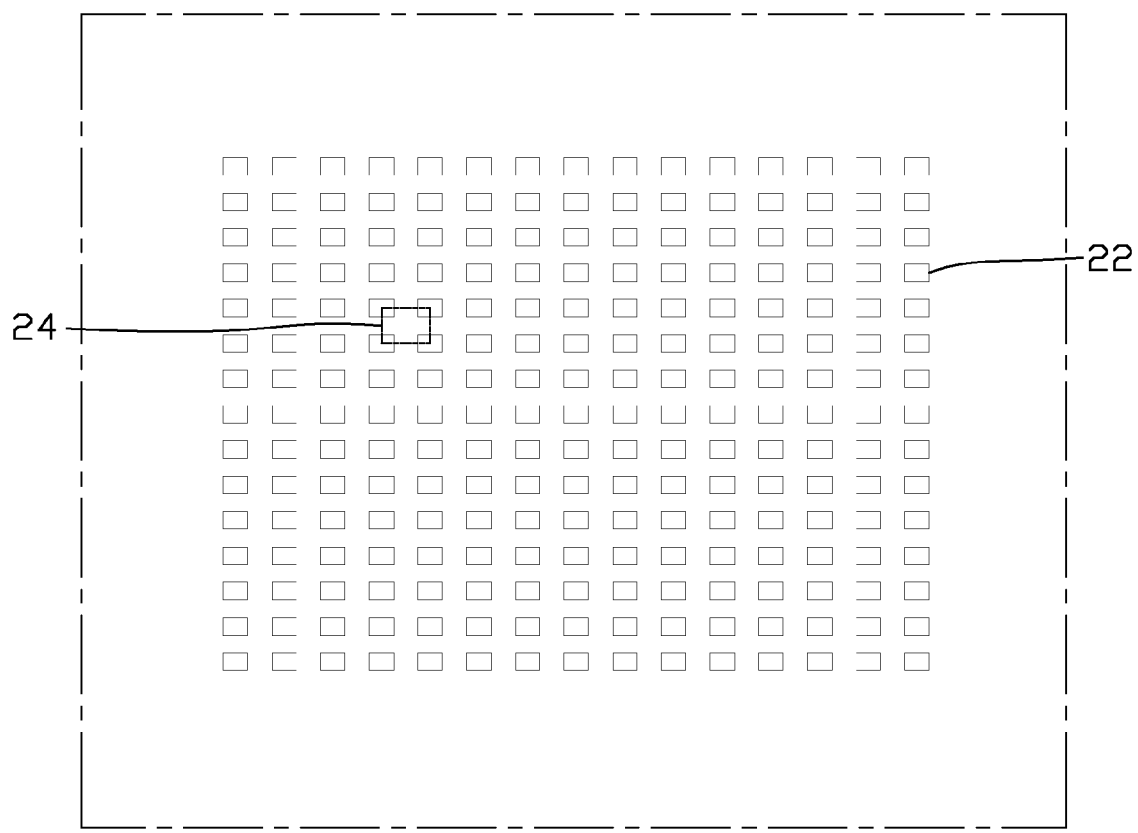
FIG. 3 is an enlarged view of a circled portion III of FIG. 2.

Referring to FIGS. 1-3, one embodiment of a calibration plate 1 is configured to revise an image capture apparatus 107 of a vision measuring system 100. The vision measuring system 100 is capable of being connected to a display unit (not shown) to display an image captured from the image capture apparatus 107. The vision measuring system 100 includes a horizontal worktable 101, a bracket 103, and a top cover 105. The bracket 103 is mounted across and above the worktable 101. The top cover 105 is mounted to a middle part of the bracket 103. The image capture apparatus 107 is coupled to the top cover 105 and positioned such that the image capture apparatus 107 captures an image positioned on the worktable 101. In one embodiment, the image capture apparatus 107 may be a charge coupled device (CCD) camera.

The vision measuring system 100 further includes an X-axis driving system, a Y-axis driving system, and a Z-axis driving system (not shown). The X-axis driving system is capable of driving the bracket 103 to move along an X axis of a mechanism coordinate system. As shown in FIG. 1, the X axis is parallel to the worktable 101. The Y-axis driving system is capable of driving the bracket 103 to move along a Y axis of the mechanism coordinate system. As shown in FIG. 1, the Y axis is parallel to the worktable 101 and perpendicular to the X axis. The Z-axis driving system is capable of driving the bracket 103 to move along a Z axis of the mechanism coordinate system. As shown in FIG. 1, the Z axis is perpendicular to the worktable 101.

The calibration plate 1 includes a generally quadrate-shaped portion 10 made of transparent material, such as glass. A plurality of calibration areas 20 with different sizes, and a zero marker 30 are formed on the portion 10. Each calibration area 20 corresponds to a magnification multiplier of the image capture apparatus 107, and is rectangular comprising a plurality of regions 22 having same shape as shown in FIG. 3. In one embodiment, each calibration area 20 includes 15*15 regions 22 arranged in a matrix form. However, the number of regions may vary depending on the embodiment. Each region 22 is rectangular.

Figure 4:
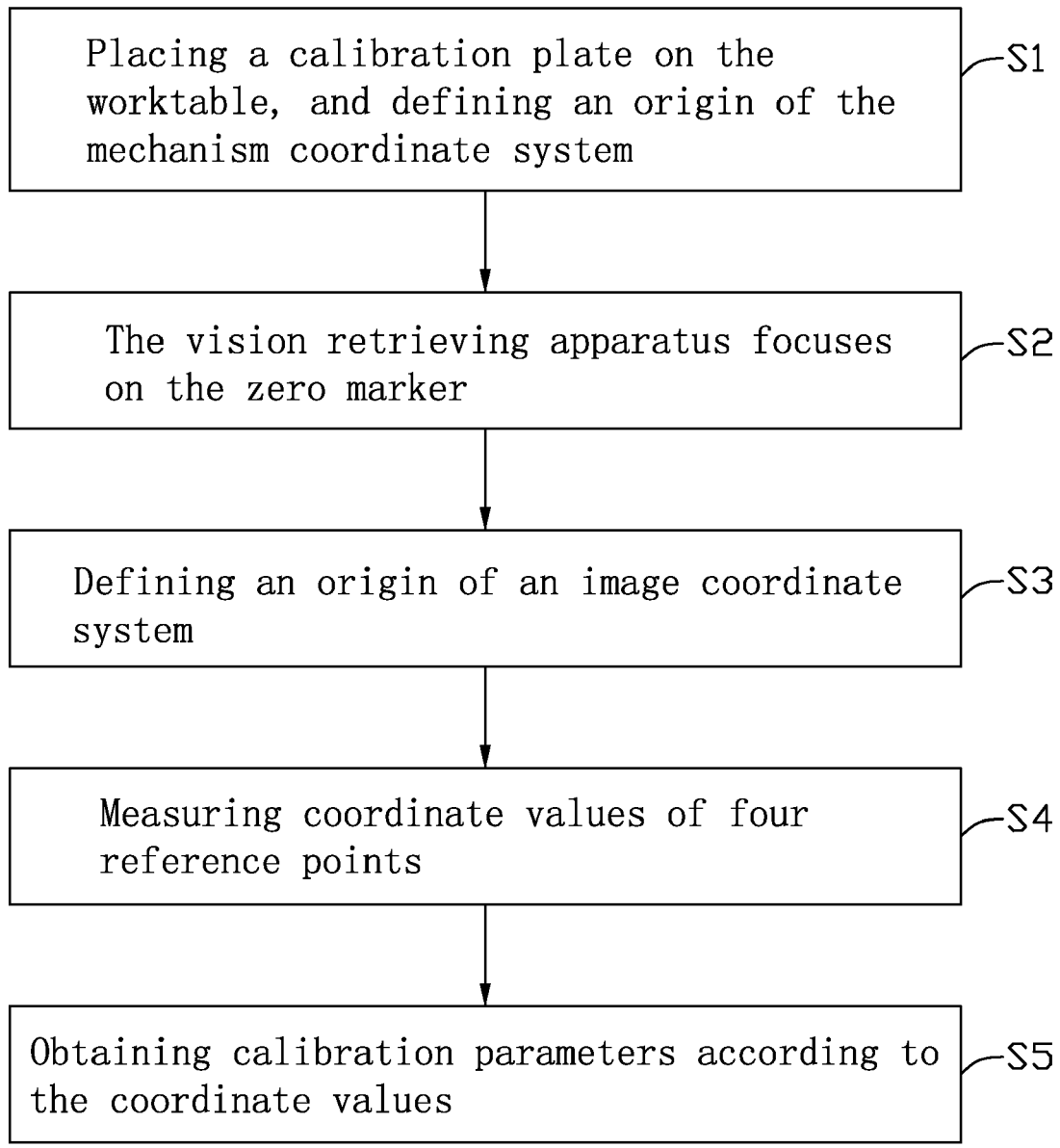
FIG. 4 is a flowchart of an embodiment of a calibration method.

FIG. 4 is a flowchart of one embodiment of a calibration method for the vision measuring system 100. Depending on the embodiment, additional blocks may be added, others deleted, and the ordering of the blocks may be changed.

In block S1, the calibration plate 1 is placed on the worktable 101 of the vision measuring system 100 such that two opposite sides of each region 22 are parallel to the X axis, and the other two opposite sides of each region 22 are parallel to the Y axis of the mechanism coordinate system. The center of the zero marker 30 is defined as the origin of the mechanism coordinate system.

In block S2, the X and Y-axis driving systems are operated to center the image capture apparatus 107 over the zero marker 30. The Z-axis driving system is operated to control the image capture apparatus 107 focus on the zero marker 30.

In block S3, a corresponding calibration area 20 is selected according to the magnification multiplier in use on the image capture apparatus 107. The image capture apparatus 107 is adjusted so as to capture a substantially clear, distinct, and full image of all the plurality of regions 22 of the selected calibration area 20. A center of the image of the plurality of regions 22 of the selected calibration area 20 is defined as the origin of an image coordinate system. The image coordinate system is a coordinate system of the image of the selected calibration area 20. The X, Y, and Z-axis of the image coordinate system are parallel to the X, Y, and Z-axis of the mechanism coordinate system, respectively.

In block S4, a first reference point of one of the plurality of regions 22 of the selected calibration area 20 is measured to obtain a X-coordinate and a Y-coordinate of the first reference point in the image coordinate system. In one embodiment, the first reference point is the center point of the region 22. Two points on two opposite sides of the region 22 which are parallel to the X axis of the mechanism coordinate system are selected. An average value of the two X coordinates is defined as the X coordinate of the center point of the region 22 on the X axis of the image coordinate system. For example, the two X coordinates of two points on two opposite sides of the region 22 may be 5 and 3. Accordingly, the average value of the two X coordinates is 4 because ((5+3)/2)=4, such that the X coordinate of the center point of the region 22 is 4. Moreover, two points on the other two opposite sides of the region 22 which are parallel to the Y axis of the mechanism coordinate system are selected. An average value of the two Y coordinates is defined as the Y coordinate of the center point of the region 22 on the Y axis of the image coordinate system. For example, the two Y coordinates of the two points on two opposite sides of the region 22 may be 2 and 4. The average value of the two Y coordinate is 3 because ((2+4)/2)=3, such that the Y coordinate of the center point of the region 22 is 3. As a result, the X-coordinate and the Y-coordinate of the first reference point in the image coordinate system are (4,3). Moreover, another three reference points of other regions 22 of the selected calibration area 20 are measured to get XY coordinates of the three center points, for those regions 22, in the image coordinate system.

In block S5, a plurality of calibration parameters are obtained according to the XY coordinates of the mechanism coordinate system of the four reference points, and the XY coordinates of the image coordinate system of the four reference points. In one embodiment, the calibration parameters are obtained via a bilinear equation.

Referring to FIG. 3, the four reference points of four regions 22 form a rectangle 24. A relation of the XY coordinates of the mechanism coordinate system of each reference point, and the XY coordinates of the image coordinate system of each reference point can be denoted by the following formulas (1) and (2):

$$x' = c_1 x + c_2 y + c_3 xy + c_4 \quad (1)$$

$$y' = c_5 x + c_6 y + c_7 xy + c_8 \quad (2)$$

where, x and y denote the coordinates on X axis and Y axis of the mechanism coordinate system of each reference point correspondingly, x' and y' denote the coordinates on X axis and Y axis of the image coordinate system of each reference point correspondingly, and $c_1$-$c_8$ are calibration parameters correspondingly. In one embodiment, x and y can be obtained by measuring the calibration plate 1 according to the four reference points. As a result, four different coordinates x and y, and x' and y' can be obtained by measuring the calibration plate 1 and the image of the calibration area 20, respectively. According to the formulas (1) and (2), the calibration parameters $c_1$-$c_8$ can be obtained with the x and y of the mechanism coordinate system of the four reference points, and the x' y' of the image coordinate system of the four reference points.

When a workpiece is measured by the vision measuring system 100, if a measuring area is in the rectangle 24, an image of the measuring area of the workpiece can be calibrated with the formulas (1) and (2) correspondingly. In other words, the XY coordinates (x, y) of the measuring area of the workpiece in the mechanism coordinate system (namely an actual XY coordinates of the measuring area) can be obtained according to the calibration parameters, the XY coordinates (x', y') of the image of the measuring area of the image coordinate system, and the formulas (1) and (2). As a result, operators can revise an error between an actual XY coordinates of the measuring area of the workpiece and the XY coordinates of the image of the workpiece obtained by the image capture apparatus 107 of the vision measuring system 100.

In one embodiment, when different magnification multipliers of the vision measuring system 100 are selected, different calibration parameters can be obtained with a corresponding calibration area 20 and the method mentioned above.

The foregoing description of the various inventive embodiments of the disclosure has been presented only for the purposes of illustration and description and is not intended to be exhaustive or to limit the disclosure to the precise forms disclosed. Many modifications and variations are possible in light of the above teaching. The embodiments were chosen and described in order to explain the principles of the disclosure and their practical application so as to enable others of ordinary skill in the art to utilize the disclosure and various embodiments and with various modifications as are suited to the particular use contemplated. Alternately embodiments will become apparent to those of ordinary skill in the art to which the present disclosure pertains without departing from its spirit and scope. Accordingly, the scope of the present disclosure is defined by the appended claims rather than the foregoing description and the various inventive embodiments described therein.

What is claimed is:

1. A calibration plate configured for revising an image capture apparatus of a vision measuring system that comprises a worktable configured for supporting the calibration plate, the calibration plate comprising:
   a quadrate portion;
   a zero marker on the quadrate portion, wherein the zero marker is an origin of a mechanism coordinate system, the mechanism coordinate system is a coordinate system of the worktable of the vision measuring system; and
   a plurality of calibration areas arranged on the quadrate portion, and each calibration area comprising a plurality of regions having the same shape and a plurality of reference points;
   wherein the plurality of calibration areas correspond to different magnification multipliers of the image capture apparatus; an image capture apparatus is controlled to focus on a calibration area of the calibration areas corresponding to a magnification multiplier to obtain an image of the calibration area, a center of the image of the calibration area is an origin of an image coordinate system, the image coordinate system is a coordinate system of the image of the calibration area corresponding to the magnification multiplier, a calibration parameter corresponding to the magnification multiplier is obtained according to the coordinates of the plurality of reference points in the image coordinate system and the mechanism coordinate system.

2. The calibration plate of claim 1, wherein the plurality of regions are rectangular.

3. The calibration plate of claim 2, wherein the plurality of regions are arranged in a matrix.

4. The calibration plate of claim 1, wherein each calibration area is rectangular comprising a plurality of rectangular regions, and two opposite sides of each rectangular region are parallel to an X-axis of the mechanism coordinate system, and the other opposite sides of each rectangular region are parallel a Y-axis of the mechanism coordinate system.

5. A calibration method configured for revising an image capture apparatus of a vision measuring system that comprises a worktable capable of moving along an X axis and a Y axis of a mechanism coordinate system, the calibration method comprising:
   providing a calibration plate to be supported on the worktable, wherein the calibration plate comprises a calibration area and a zero marker;
   defining the zero marker as an origin of the mechanism coordinate system;
   selecting a plurality of reference points in the calibration area, and controlling the image capture apparatus to focus on the calibration area;
   defining an origin of an image coordinate system, wherein the image coordinate system is a coordinate system of the image of the calibration area, and a center of the image of the plurality of regions is defined as an origin of the image coordinate system;
   measuring coordinates of the reference points in the mechanism coordinate system and the image coordinate system; and
   obtaining calibration parameters according to the coordinates of the reference points in the mechanism coordinate system and the image coordinate system.

6. The calibration method of claim 5, wherein the calibration area is rectangular comprising a plurality of rectangular regions, and two opposite sides of each rectangular region are parallel to the X-axis of the mechanism coordinate system, and the other opposite sides of each rectangular region are parallel the Y-axis of the mechanism coordinate system.

7. The calibration method of claim 5, wherein the plurality of regions are arranged in a matrix.

* * * * *